(12) United States Patent
Zheng

(10) Patent No.: US 9,372,369 B2
(45) Date of Patent: Jun. 21, 2016

(54) LIQUID CRYSTAL PANEL AND MANUFACTURING METHOD THEREOF

(71) Applicant: Shenzhen China Star Optoelectronics Technology Co., Ltd., Shenzhen, Guangdong (CN)

(72) Inventor: Hua Zheng, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 72 days.

(21) Appl. No.: 14/396,053

(22) PCT Filed: Sep. 25, 2014

(86) PCT No.: PCT/CN2014/087383
§ 371 (c)(1),
(2) Date: Oct. 21, 2014

(87) PCT Pub. No.: WO2016/041217
PCT Pub. Date: Mar. 24, 2016

(65) Prior Publication Data
US 2016/0085103 A1    Mar. 24, 2016

(30) Foreign Application Priority Data
Sep. 18, 2014 (CN) .......................... 2014 1 04782953

(51) Int. Cl.
| G02F 1/1339 | (2006.01) |
| G02F 1/1333 | (2006.01) |
| G02F 1/1335 | (2006.01) |
| G03F 7/16 | (2006.01) |
| G03F 7/20 | (2006.01) |
| G03F 7/32 | (2006.01) |

(52) U.S. Cl.
CPC ...... *G02F 1/13394* (2013.01); *G02F 1/133514* (2013.01); *G03F 7/16* (2013.01); *G03F 7/2022* (2013.01); *G03F 7/325* (2013.01); *G02F 2001/13396* (2013.01)

(58) Field of Classification Search
CPC ............ G02F 1/13394; G02F 1/13377; G02F 1/133512; G02F 1/133707; G02F 1/1339; G02F 2001/13396; G02F 1/1333; G02F 1/133305; G02F 1/133351
USPC .................................................. 349/156, 158
See application file for complete search history.

(56) References Cited

U.S. PATENT DOCUMENTS

2014/0092350 A1*  4/2014  Byeon ................... G02F 1/1339
349/106

* cited by examiner

*Primary Examiner* — Mike Qi
(74) *Attorney, Agent, or Firm* — Andrew C. Cheng

(57) ABSTRACT

A manufacturing method for a liquid crystal panel, comprising: coating a photoresist layer on a substrate; utilizing a first exposure energy and a first mask for executing a first exposure process to form a spacing column having a first height, wherein, the first mask has a first light transparent area corresponding to a dark area; utilizing a second exposure energy and a second mask for executing a second exposure process to form a spacing column having a second height, wherein, the second mask has a second light transparent area corresponding to the dark area, and the second height is greater than the first height; and removing an unexposed portion of the photoresist layer. Through above way, the present invention can improve the pixel transmittance of the dark area in order to reduce or eliminate the dark area.

11 Claims, 3 Drawing Sheets

LIQUID CRYSTAL PANEL AND MANUFACTURING METHOD THEREOF

BACKGROUND OF THE INVENTION

1. Field of the Invention

The present invention relates to the technical field of liquid crystal display, and more particularly to a liquid crystal panel and a manufacturing method thereof in order to reduce or eliminate a dark area of the liquid crystal panel performing a curved display.

2. Description of Related Art

Currently, when a liquid crystal display panel, such as a TFT-LCD (Thin Film Transistor-Liquid Crystal Display) panel, is performing a curved display, a dark area is easily to generate at the most serious bending location of a curve surface. Generally, the dark area is located a half of a center of the liquid crystal panel to a right or a left edge. The reason is that at that location, the shift of the upper substrate and lower substrate of the liquid crystal panel is the most serious. The shift distance is larger such that the black matrix shield more lights. As a result, a pixel transmittance at that location is lower than other areas so as to affect the display effect.

SUMMARY OF THE INVENTION

Accordingly, a technology problem solved by an embodiment of the present invention is to provide a manufacturing method for a liquid crystal panel, comprising: coating a photoresist layer on a substrate, wherein, the substrate corresponds to a color filter substrate for forming the liquid crystal panel, and the photoresist layer is made of a negative photoresist material; utilizing a first exposure energy and a first mask for executing a first exposure process to form a spacing column having a first height, wherein, the first mask has a first light transparent area corresponding to a dark area of the liquid crystal panel performing a curved display; utilizing a second exposure energy and a second mask for executing a second exposure process to the photoresist layer which has been processed by the first exposure process so as to form a spacing column having a second height on an area of the substrate corresponding to the dark area, wherein, the second mask has a second light transparent area corresponding to the dark area; the second height is greater than the first height; the first height is greater than or equal to a half of a third height; the second height is less than or equal to one and a half of the third height; the third height is a height of a spacing column formed by utilizing the first mask and a third exposure energy for executing an exposure process to the photoresist layer; the third exposure energy is greater than the first exposure energy; and removing an unexposed portion of the photoresist layer.

Wherein, the spacing column having the second height correspondingly locates within the second light transparent area, and a width of the second light transparent area is greater than a width of the first light transparent area.

Wherein, the first mask is disposed between the second mask and the photoresist layer for executing the second exposure process; an area of the first mask is greater than or equal to an area of the liquid crystal panel; the first light transparent area correspondingly locates within the second light transparent area.

Wherein, utilizing a development process to remove the unexposed portion of the photoresist layer.

In order to solve the above technology problem, another embodiment of the present invention is: a manufacturing method for a liquid crystal panel, comprising: coating a photoresist layer on a substrate; utilizing a first exposure energy and a first mask for executing a first exposure process to form a spacing column having a first height, wherein, the first mask has a first light transparent area corresponding to a dark area of the liquid crystal panel performing a curved display; utilizing a second exposure energy and a second mask for executing a second exposure process to the photoresist layer which has been processed by the first exposure process so as to form a spacing column having a second height on an area of the substrate corresponding to the dark area, wherein, the second mask has a second light transparent area corresponding to the dark area; the second height is greater than the first height; and removing an unexposed portion of the photoresist layer.

In order to solve the above technology problem, another embodiment of the present invention is: a liquid crystal panel, comprising: a substrate; a spacing column having a first height disposed on the substrate; and a spacing column having a second height disposed on the substrate; wherein, the second height is greater than the first height; the spacing column having the second height correspondingly locates at a dark area of the liquid crystal panel performing a curved display.

Wherein, the first height is greater than or equal to a half of a third height; the second height is less than or equal to one and a half of the third height; the third height is a height of a spacing column formed by utilizing a mask for executing an exposure process to a photoresist layer; the mask has an opening area corresponding to the dark area; an exposure energy used in the exposure process is greater than an exposure energy used for forming the spacing column having the first height.

Through the above technology solutions, advantageous effects of embodiments of the present invention are: through the spacing column having the second height corresponding to the dark area, and the spacing column having the first height outside the dark area, and the second height is greater than the first height such that a thickness of the liquid crystal layer corresponding to the dark area is greater than a thickness of the liquid crystal layer outside the dark area. The increased thickness of the dark area can improve the liquid crystal efficiency. The pixel transmittance of the liquid crystal panel at the dark area is guaranteed in order to reduce or eliminate the dark area.

DETAILED DESCRIPTION OF THE PREFERRED EMBODIMENT

The following content combines with the drawings and the embodiment for describing the present invention in detail.

Figure 1:
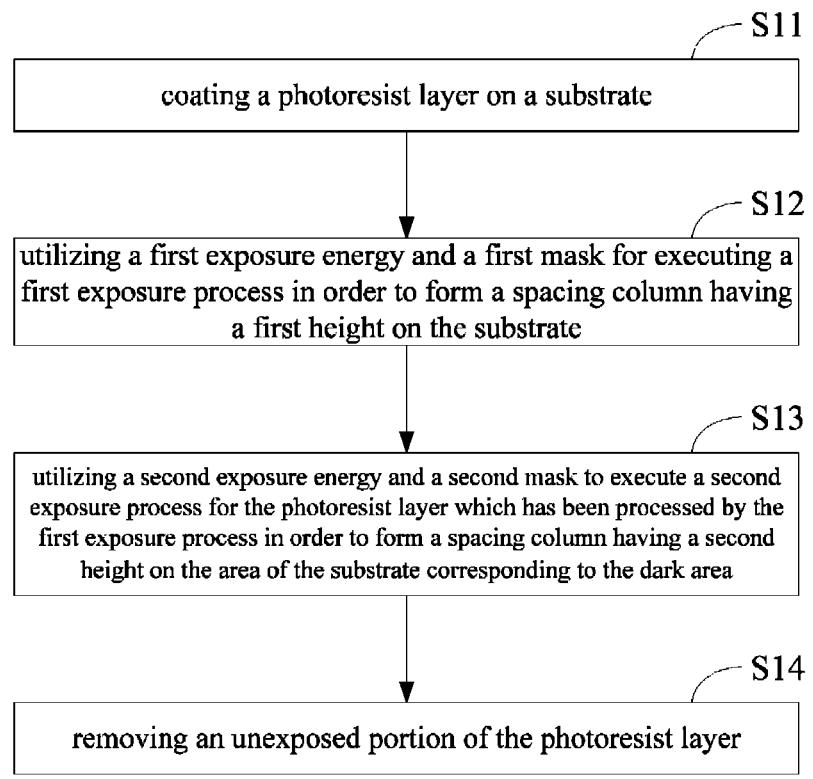
FIG. 1 is a flowchart of a manufacturing method of a liquid crystal panel according to an embodiment of the present invention.

FIG. 1 is a flowchart of a manufacturing method of a liquid crystal panel according to an embodiment of the present invention. As shown in FIG. 1, the manufacturing method of the liquid crystal panel including following steps:

Step S11: coating a photoresist layer on a substrate.

Figure 2:
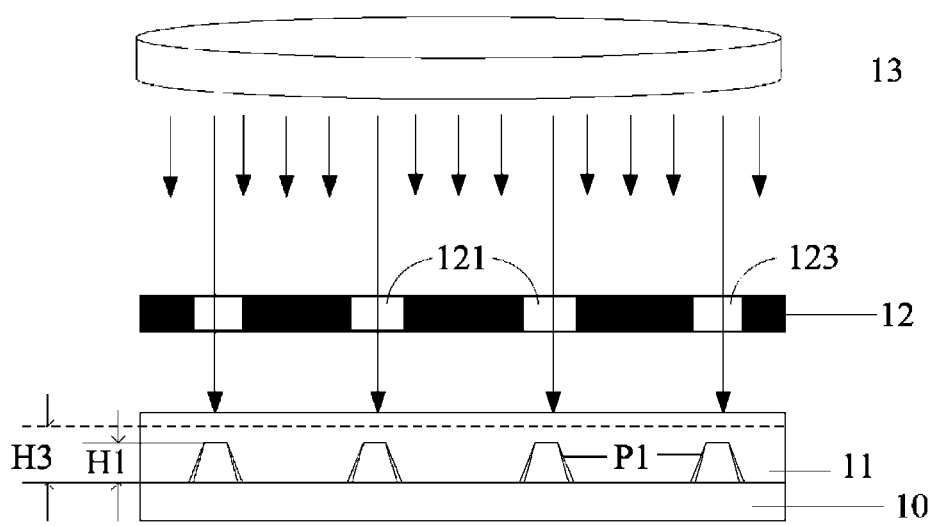
FIG. 2 is schematic diagram of executing a first exposure process according to an embodiment of the present invention.

As shown in FIG. 2, the substrate 10 corresponds to a color filter substrate of the liquid crystal panel, and can be a glass substrate, a plastic substrate or a flexible substrate. The photoresist layer 11 is evenly coated on the substrate 10, and is preferably made of a negative photoresist material.

Step S12: utilizing a first exposure energy and a first mask for executing a first exposure process in order to form a spacing column having a first height on the substrate.

As shown in FIG. 2, the first mask 12 has a first light transparent area 121 corresponding to a dark area of the liquid crystal panel performing a curved display. Preferably, the number of the first light transparent area 121 is two. Of course, the first mask 12 also includes a third light transparent area 123 which is not corresponding to the dark area and is outside the dark area. It should be noted that the width and the structure shape of the first light transparent area 121 and the third light transparent area 123 are the same.

The first mask 12 is equal to a pattern mask used for manufacturing a spacing column in the prior art. The manufacturing process may be: first, marking a location of the spacing column of the liquid crystal panel; then, designing the first light transparent area 121 and the third light transparent area 123 on the mask substrate according to the marked location; wherein, the mask substrate is a transparent-hard material such as glass or quartz; the surface of the mask substrate is coated with an opaque metal layer such as Cr (chromium), Al (aluminum), Cu (copper), Mo (molybdenum), or a combination of them; finally, etching the opaque metal layer corresponding to the first light transparent area 121 and the third light transparent area 123, and cleaning to obtain the first mask 12. To ensure the exposure area during the exposure process, the present embodiment further selects the mask substrate such that an area of the first mask 12 is greater than or equal to an area of the liquid crystal panel.

With reference to FIG. 2 again, placing the substrate 10 coated with the photoresist layer 11 into an exposure machine; disposing the first mask 12 above the substrate 10 and aligning such that the first light transparent area 121 of the first mask 12 corresponds to and aligns with an area of the substrate 10 corresponding to the dark area. Then, turning on a light source 13 to execute a first exposure process. Wherein, the light source 13 is an ultraviolet (UV) light source. The lights (shown by arrows) have a first exposure energy E1 during the first exposure process.

After the photoresist layer 11 made by the negative photoresist material receives the first exposure energy E1, an insoluble substance is formed, that is, a spacing column P1 having a first height H1 is formed corresponding to the exposure location. It should be noted that the first height H1 of the spacing column P1 formed by the foregoing method is less than a height of a spacing column formed by a normal exposure process. For example, in the normal exposure process, the lights have a third exposure energy E3. The height of the spacing column under the normal exposure process is a third height H3. That is, the third height H3 is formed by utilizing the first mask 12 and the third exposure energy E3 to expose the photoresist layer 11. Because when the exposure time is longer, the height of the insoluble substance is higher. That is, the first height H1 is less than the third height H3. The third exposure energy E3 of the normal exposure process must be controlled to greater than the first exposure energy E1 of the present embodiment.

Step S13: utilizing a second exposure energy and a second mask to execute a second exposure process for the photoresist layer which has been processed by the first exposure process in order to form a spacing column having a second height on the area of the substrate corresponding to the dark area.

Figure 3:
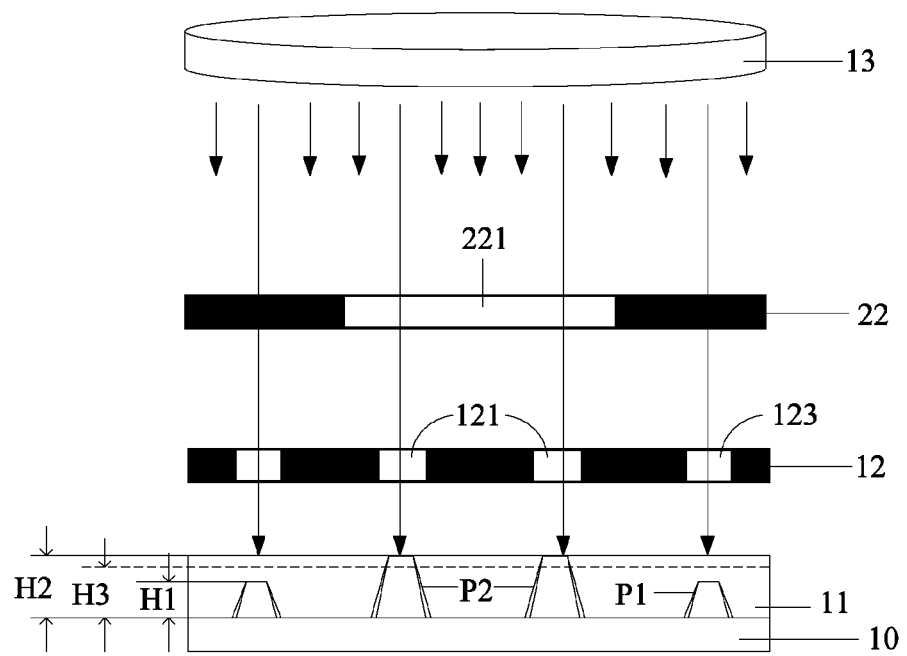
FIG. 3 is schematic diagram of executing a second exposure process according to an embodiment of the present invention.
Figure 4:
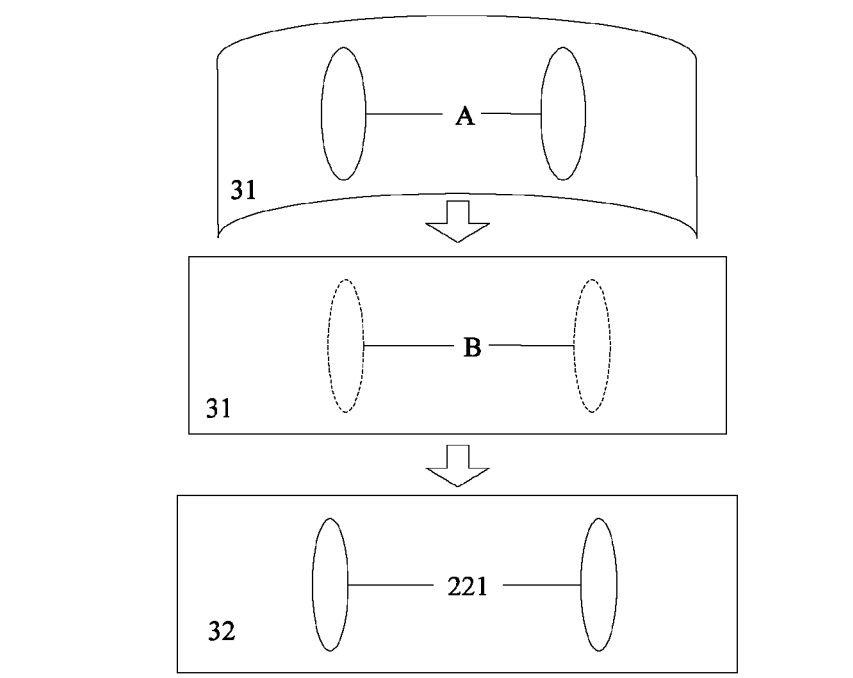
FIG. 4 is schematic diagram of a second mask according to an embodiment of the present invention.

As shown in FIG. 3, the second mask 22 has a second light transparent area 221 corresponding to the dark area. A width of the second light transparent area 221 is greater than a width of the first transparent area 121. In this embodiment, the second mask 22 is an area-selection mask different from the pattern mask in the prior art. Combining with FIG. 4, the manufacturing process is basically the same as the first mask 12:

First, marking a dark area A generated when the liquid crystal panel 31 is performing a curved display. Then, flattening the liquid crystal panel 31, and according to the marking, designing a light transparent area B having a shape the same as the dark area A on a mask substrate 32. Wherein, the mask substrate 32 is made of a transparent-hard material such as glass or quartz, and the surface of the mask substrate 32 is coated with an opaque metal layer such as Cr (chromium), Al (aluminum), Cu (copper), Mo (molybdenum), or a combination of them. Finally, etching the opaque film layer at the light transparent area B, and cleaning to obtain the second mask 22. To ensure the exposure area during the exposure process, the mask substrate 32 is further selected, that is, an area of the second mask 22 is greater than an area of the liquid crystal panel 31.

With reference to FIG. 3 again, disposing the second mask 22 between the light source 13 and the first mask 12, that is, disposing the first mask 12 between the second mask 22 and the photoresist layer 11 in order to execute a second exposure process. During the second exposure process, the first light transparent area 121 of the first mask 12 is located within a vertical projection range which is projected to the substrate 10 and projected by the second light transparent area 221 of the second mask 22. Besides, the lights emitted by the light source 13 have a second exposure energy E2.

After the photoresist layer 11 made by the negative photoresist material receives the second exposure energy E2, an insoluble substance is continuously formed above the spacing column P1 having the first height H1 corresponding to the dark area in the step S12. Accordingly, corresponding to the second light transparent area 221, a spacing column P2 having a second height H2 is formed. The second height H2 of the spacing column P2 is greater than the first height H1 of the spacing column P1.

It should be noted that the spacing column P2 has an increased height (H2−H1) relative to the spacing column P1. The increased height (H2−H1) is less than the third height H3 formed by the normal exposure process. In the present embodiment, the first height is greater than or equal to a half of the third height H3. That is, the first height H1 is not less than 50% of the third height under the normal exposure process. The second height H2 is less than or equal to one and a half of the third height H3. That is, the second height is not higher than 50% of the third height H3 under the normal exposure process. Accordingly, the second exposure energy E2 is less than the first exposure energy E1.

Step S14: removing an unexposed portion of the photoresist layer.

After finish the above step S12 and step S13, a development process is applied to a portion of the photoresist layer 11 which is not exposed by the first exposure process and the second exposure process. At this time, at the dark area, the spacing column P2 having the second height H2 is formed. Outside the dark area, the spacing column P1 having the first height H1 is formed, and the second height H2 is greater than the first height H1 such that a thickness of the liquid crystal layer corresponding to the dark area A is greater than a thickness of the liquid crystal layer outside the dark area. According to the formula: pixel transmittance=aperture ratio*liquid crystal efficiency (that is, the light transmittance of an unit opening area) known as a common knowledge in the liquid crystal display field, increasing the thickness of the liquid crystal layer can increase the liquid crystal efficiency. As a result, the light transmittance of the liquid crystal panel at the dark area A is guaranteed. Comparing to the prior art, the dark area A can be reduce or eliminated in order to increase the curve display effect.

Comparing to the prior art, the present invention can be deemed as adding an area-selection mask (the second mask 22) in the exposure process of the photolithography process. A shape of the light transparent area of the area-selection mask (the second light transparent area 221) is the same as the shape of the dark area. The present invention changes the original "one time exposure" (the third exposure energy E3) to "two times exposure" (the first exposure energy E1+the second exposure energy E2). That is, the first exposure process is an exposure process for entire panel without using the area-selection mask. The first exposure energy E1 makes the spacing column of the entire liquid crystal panel reach the first height H1 (lower than the normal third height H3). The second exposure process is an exposure process for selecting an area. The opaque area of the area-selection mask is utilized to shield an area of the liquid crystal panel not corresponding to the dark area. The second exposure energy E2 is emitted from the light transparent area of the area-selection mask such that the spacing column corresponding to the dark area further reaches the second height (higher than the normal third height H3).

It should be noted that the "two times exposure" is necessary, and the reason is as following:

For one time exposure using one mask, a normal pattern mask (the first mask 12) is used such that a height of a spacing column corresponding to the dark area is higher than a height of a spacing column not corresponding to the dark area. The method has a great drawback. First, the dark area is irregular in shape, and it is very hard to design the pattern mask preliminarily and at once. If it cannot be successful at once, it should design and manufacture the pattern mask again or repeatedly. However, the precision of the pattern is about 0.1 micron, and the cost is several hundred thousand dollars such that the cost is too high. Second, the above method can only be applied to the liquid crystal panel with a fixed curvature. That is, one pattern mask can only produce a liquid crystal panel with a fixed curvature. If a flat liquid crystal panel is required to be produced, the pattern mask should be redesigned. The cost is too high to afford.

However, the two times exposure using two masks in the present invention. The above drawbacks do not exist. The pattern mask is designed according to the specification of a flat liquid crystal panel. The precision of the area-selection mask is only about 1 millimeter. The shape corresponds to the dark area is also simple. The cost is greatly reduced.

Even the design of the area-selection mask has an error at first time. Repeatedly designing and manufacturing the area-selection mask will not spend high material and artificial cost. Besides, when manufacturing a flat liquid crystal panel, the pattern mask is used directly. The different products with the same size such as a 55-inch FHD (Full High Definition) and a 55-inch UD (Ultra Low Dispersion) format liquid crystal panels can be shared the same area selection mask, which lower the manufacturing cost.

Figure 5:
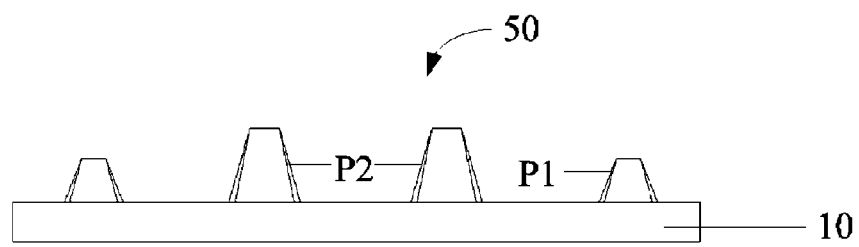
FIG. 5 is a cross-sectional view of a color filter substrate manufactured by the method shown in FIG. 1.
Figure 6:
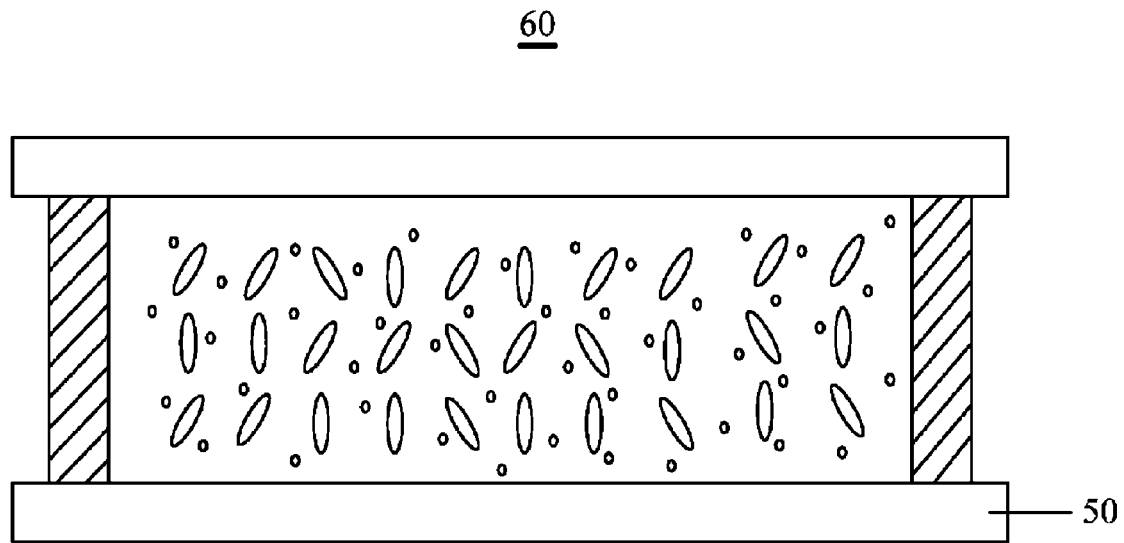
FIG. 6 is a cross-sectional view of a liquid crystal panel having the color filter substrate shown in FIG. 5.

An embodiment of the present invention also provides a color filter substrate manufactured by the above method as a color filter substrate 50 shown in FIG. 5, and a liquid crystal panel 60 including the color filter substrate 50 shown in FIG. 6. The technology effects are all the same.

In summary, in the preset invention, through the spacing column having the second height corresponding to the dark area, and the spacing column having the first height outside the dark area, and the second height is greater than the first height such that a thickness of the liquid crystal layer corresponding to the dark area is greater than a thickness of the liquid crystal layer outside the dark area. The increased thickness of the dark area can improve the liquid crystal efficiency. The pixel transmittance of the liquid crystal panel at the dark area is guaranteed in order to reduce or eliminate the dark area.

The above embodiments of the present invention are not used to limit the claims of this invention. Any use of the content in the specification or in the drawings of the present invention which produces equivalent structures or equivalent processes, or directly or indirectly used in other related technical fields is still covered by the claims in the present invention.

What is claimed is:

1. A manufacturing method for a liquid crystal panel, comprising:
    coating a photoresist layer on a substrate, wherein, the substrate corresponds to a color filter substrate for forming the liquid crystal panel, and the photoresist layer is made of a negative photoresist material;
    utilizing a first exposure energy and a first mask for executing a first exposure process to form a spacing column having a first height, wherein, the first mask has a first light transparent area corresponding to a dark area of the liquid crystal panel performing a curved display;
    utilizing a second exposure energy and a second mask for executing a second exposure process to the photoresist layer which has been processed by the first exposure process so as to form a spacing column having a second height on an area of the substrate corresponding to the dark area, wherein, the second mask has a second light transparent area corresponding to the dark area; the second height is greater than the first height; the first height is greater than or equal to a half of a third height; the second height is less than or equal to one and a half of the third height; the third height is a height of a spacing column formed by utilizing the first mask and a third exposure energy for executing an exposure process to the photoresist layer; the third exposure energy is greater than the first exposure energy; and
    removing an unexposed portion of the photoresist layer.

2. The manufacturing method according to claim 1, wherein, the spacing column having the second height correspondingly locates within the second light transparent area, and a width of the second light transparent area is greater than a width of the first light transparent area.

3. The manufacturing method according to claim 2, wherein, the first mask is disposed between the second mask and the photoresist layer for executing the second exposure process; an area of the first mask is greater than or equal to an area of the liquid crystal panel; the first light transparent area correspondingly locates within the second light transparent area.

4. The manufacturing method according to claim 1, wherein, utilizing a development process to remove the unexposed portion of the photoresist layer.

5. A manufacturing method for a liquid crystal panel, comprising:

coating a photoresist layer on a substrate;

utilizing a first exposure energy and a first mask for executing a first exposure process to form a spacing column having a first height, wherein, the first mask has a first light transparent area corresponding to a dark area of the liquid crystal panel performing a curved display;

utilizing a second exposure energy and a second mask for executing a second exposure process to the photoresist layer which has been processed by the first exposure process so as to form a spacing column having a second height on an area of the substrate corresponding to the dark area, wherein, the second mask has a second light transparent area corresponding to the dark area; the second height is greater than the first height; and removing an unexposed portion of the photoresist layer.

6. The manufacturing method according to claim 5, wherein, the spacing column having the second height correspondingly locates within the second light transparent area, and a width of the second light transparent area is greater than a width of the first light transparent area.

7. The manufacturing method according to claim 6, wherein, the first mask is disposed between the second mask and the photoresist layer for executing the second exposure process; an area of the first mask is greater than or equal to an area of the liquid crystal panel; the first light transparent area correspondingly locates within the second light transparent area.

8. The manufacturing method according to claim 5, wherein, the first height is greater than or equal to a half of a third height; the second height is less than or equal to one and a half of the third height; the third height is a height of a spacing column formed by utilizing the first mask and a third exposure energy for executing an exposure process to the photoresist layer; the third exposure energy is greater than the first exposure energy.

9. The manufacturing method according to claim 5, wherein, the photoresist layer is made of a negative photoresist material.

10. The manufacturing method according to claim 9, wherein, utilizing a development process to remove the unexposed portion of the photoresist layer.

11. The manufacturing method according to claim 5, wherein, the substrate corresponds to a color filter substrate for forming the liquid crystal panel.

* * * * *